US009722614B2

(12) United States Patent
Muir et al.

(10) Patent No.: US 9,722,614 B2
(45) Date of Patent: Aug. 1, 2017

(54) SYSTEM AND METHOD FOR MANAGING PIPELINES IN RECONFIGURABLE INTEGRATED CIRCUIT ARCHITECTURES

(71) Applicant: Qualcomm Incorporated, San Diego, CA (US)

(72) Inventors: Mark Ian Roy Muir, San Diego, CA (US); Sami Khawam, San Diego, CA (US); Ioannis Nousias, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 339 days.

(21) Appl. No.: 14/553,754

(22) Filed: Nov. 25, 2014

(65) Prior Publication Data

US 2016/0149580 A1 May 26, 2016

(51) Int. Cl.
*G06F 13/10* (2006.01)
*H03K 19/177* (2006.01)
*H03K 19/0175* (2006.01)
*G06F 12/02* (2006.01)
*G06F 13/24* (2006.01)
(Continued)

(52) U.S. Cl.
CPC ..... *H03K 19/17764* (2013.01); *G06F 9/3897* (2013.01); *G06F 12/023* (2013.01); *G06F 13/24* (2013.01); *G06F 15/7867* (2013.01); *H03K 19/017581* (2013.01); *H03K 19/1774* (2013.01);
(Continued)

(58) Field of Classification Search
None
See application file for complete search history.

(56) References Cited

U.S. PATENT DOCUMENTS

| 7,734,894 B1 * | 6/2010 | Wentzlaff | G06F 15/16 712/10 |
| 8,589,666 B2 * | 11/2013 | Hammes | G06F 8/456 712/241 |

(Continued)

OTHER PUBLICATIONS

International Search Report and Written Opinion—PCT/US2015/060764—ISA/EPO—Mar. 14, 2016.

(Continued)

*Primary Examiner* — Ilwoo Park
(74) *Attorney, Agent, or Firm* — Smith Temple Blaha LLC/Qualcomm

(57) ABSTRACT

A reconfigurable logic array(RLA) uses pipeline control methods. A do-not-end step signal is communicated to a controller in response to a backpressure condition. In response, a program executing in the RLA is suspended. Source and sink elements are arranged with respective sensors that identify back pressure conditions at interfaces. The source or sink elements communicate a do-not-end step signal to the controller. Local memory interfaces and an interrupt buffer generate similar signals in response to other internal and external conditions. The controller coordinates pipelined control signals with a global counter that issues the control signals with an end-of-step signal broadcast throughout the RLA. When a number of loop iterations is known before execution of the loop instructions, the information is shared with source and sink elements and the controller, which operate accordingly in a limited mode. At appropriate times write-enable inputs of configuration registers are disabled.

30 Claims, 9 Drawing Sheets

(51) Int. Cl.
*G06F 15/78* (2006.01)
*G06F 9/38* (2006.01)
(52) U.S. Cl.
CPC ..... *H03K 19/1776* (2013.01); *G06F 2212/20* (2013.01)

(56) References Cited

U.S. PATENT DOCUMENTS

| | | |
|---|---|---|
| 8,671,371 B1 | 3/2014 | Dimond |
| 2007/0153786 A1* | 7/2007 | Kim ..................... H04L 49/901 370/389 |
| 2012/0144376 A1 | 6/2012 | Van Eijndhoven et al. |
| 2013/0298130 A1 | 11/2013 | Pienaar et al. |
| 2014/0189666 A1 | 7/2014 | Krig et al. |

OTHER PUBLICATIONS

Khawam S., et al., "The Reconfigurable Instruction Cell Array", IEEE Transactions on Very Large Scale Integration Systems, vol. 16, No. 11, Jan. 2008 (Jan. 1, 2008), pp. 75-85, XP002754725, DOI: 10.1109/TVLSI.2007.912133 Retrieved from the Internet: URL:http://ieeexpore.ieee.org/stamp/stamp.jsp?arnumber=4407539 [retrieved on Feb. 11, 2016].
Yuzhe Tang et al., Auto-pipelining for Data Stream Processing, IEEE Transactions on Parallel and Distributed Systems, 2012, pp. 1-16.

* cited by examiner

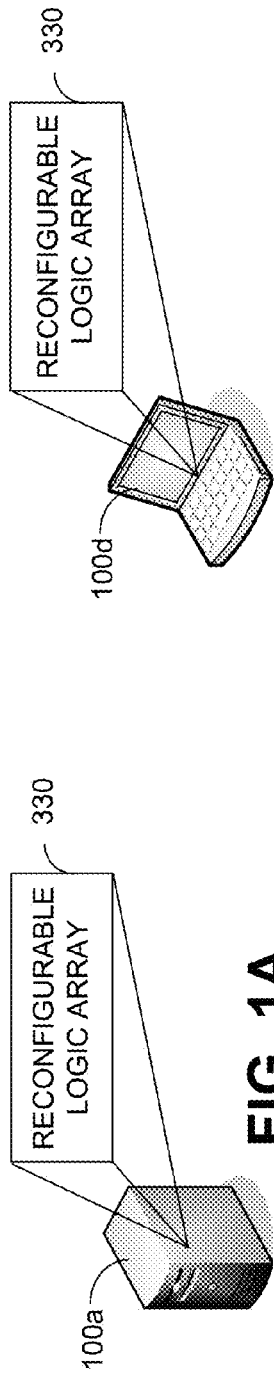
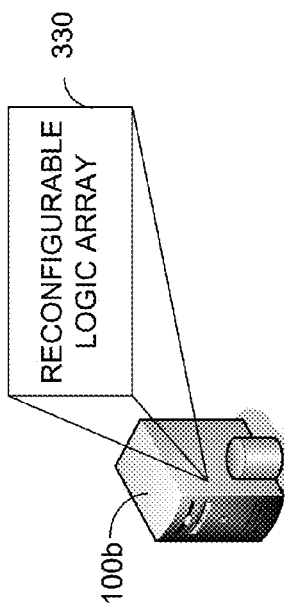
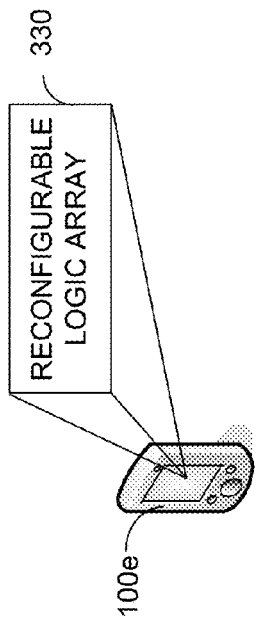
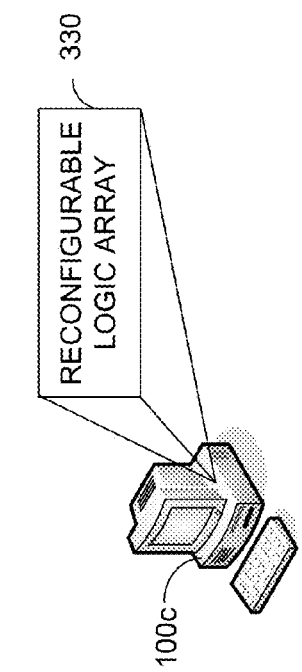
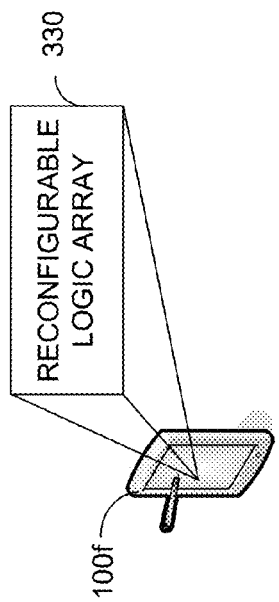
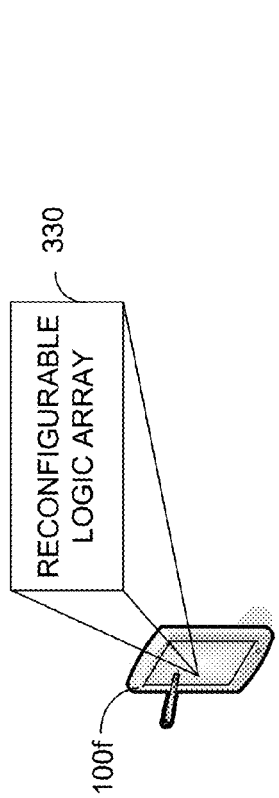

SYSTEM AND METHOD FOR MANAGING PIPELINES IN RECONFIGURABLE INTEGRATED CIRCUIT ARCHITECTURES

DESCRIPTION OF THE RELATED ART

Computing devices are ubiquitous. Computing devices rely on integrated circuits such as processors, microprocessors, application-specific integrated circuits, digital signal processors, graphics processing unit, etc., to support primary and peripheral functions.

Some conventional designs for computing devices include multiple processors of different types (such as, a central processing unit, graphics processing unit, display controller, hardware accelerators, etc.) and/or processors with multiple cores to support the various primary and peripheral functions desired for a particular computing device. Such designs often further integrate analog, digital and radio-frequency circuits or other specialized circuits to enable specific functions on a single silicon substrate and are commonly referred to as a system on a chip (SoC).

Integrated circuit designers and software engineers have long recognized the many benefits provided by both parallel instruction processing and reconfigurable circuits. Unlike the above-described conventional integrated circuits which remain fixed, reconfigurable circuit architectures arrange application-specific integrated circuit (ASIC) like structures in controlled paths of various combinations of select circuit elements.

For example, a reconfigurable instruction cell array (RICA), which is one example of a reconfigurable processor or system, includes a set of instruction cells that can be reconfigured or sequenced as may be desired. Once configured or loaded, an instruction can persist for multiple iterations as different batches of data are introduced to the configured combination of instruction cells in the controlled path. The flexibility provided by a RICA enables mapping of these processing paths for both independent and dependent instructions. A RICA is effectively a coarse-grained field programmable gate array (FPGA): algorithms can be mapped to the array as combinatorial data paths. However, unlike aFPGA, a RICA can be reconfigured very quickly. The capability to rapidly reconfigure data paths allows for control flow, similar to what is possible in a CPU or DSP. Hence, a RICA can be programmed using a conventional software programming language (e.g., C). A compiled program consists of a set of configuration contexts—each representing a set of data paths configured on the array of instruction cells. A program executes by switching between different configuration contexts.

Typical programs executing on a RICA are 'streaming.' That is, the programs apply some kind of filter to a large data set. The filters are implemented as nested loops, each level corresponding to something logical (e.g., a frame, line, or column). The innermost loop(s) contain the body of the filter, and account for the overwhelming majority of the execution time Unlike the other configuration contexts, which jump or transition to different instruction cell arrangements, the innermost loops repeat or jump back to themselves. The amount of time spent performing each separate iteration of a defined loop depends on the complexity of the data paths it contains—i.e., its critical path delay. Significant improvements can be made to program speed by splitting this critical path into pipeline stages, decreasing the effective critical path and thus increasing the iteration rate (often by an order of magnitude).

However, dynamic pipelining of data across controlled paths in a reconfigurable system is not a trivial process. For example, the additional iterations imposed by filling and flushing a dynamic pipeline complicate management and control of data processing operations: operations will execute more times than originally intended, during which the operations are performed on invalid data. Consequently, protection logic is used to prevent the corruption of internal state information of the cells (i.e., data stored in the array or local memories) and information concerning interface cells coupled to the system (e.g., a current position in the data stream(s)). If implemented as physical hardware, the protection logic increases the circuit area and operational power required to dynamically pipeline data in reconfigurable systems or introduces limits on the algorithms that can be applied or mapped to conventional reconfigurable systems.

Thus, there is a need for improved mechanisms for managing pipelines in reconfigurable processors.

SUMMARY OF THE DISCLOSURE

Alternative embodiments of computing systems and methods for managing pipelines in reconfigurable architectures are disclosed. Example embodiments illustrate hardware elements and interconnections in a management system applicable to a reconfigurable logic array (e.g., a RICA). However, those skilled in the art will be able to broadly apply the management system and methods in reconfigurable architectures that dynamically reconfigure data processing paths.

An example embodiment includes an integrated circuit including a reconfigurable logic array (RLA), an active cell and a controller. The active cell is arranged to identify a back pressure condition in an interface coupled to the active cell. The active cell communicates a do-not-end-step signal in response to the identified back pressure condition. The controller receives the do-not-end-step signal and suspends execution of a program executing in the RLA.

Another example embodiment is a method for managing pipelines in a reconfigurable processing system of a computing device. The method includes the steps of receiving, with a controller, a do-not-end-step signal responsive to a back pressure condition identified by an active cell, using the controller to generate an end-of-step signal before a change in the back pressure condition and broadcasting the end-of-step signal.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

FIGS. 1A-1F each include respective schematic diagrams illustrating example embodiments of computing devices in various form factors.

DETAILED DESCRIPTION

Figure 2:
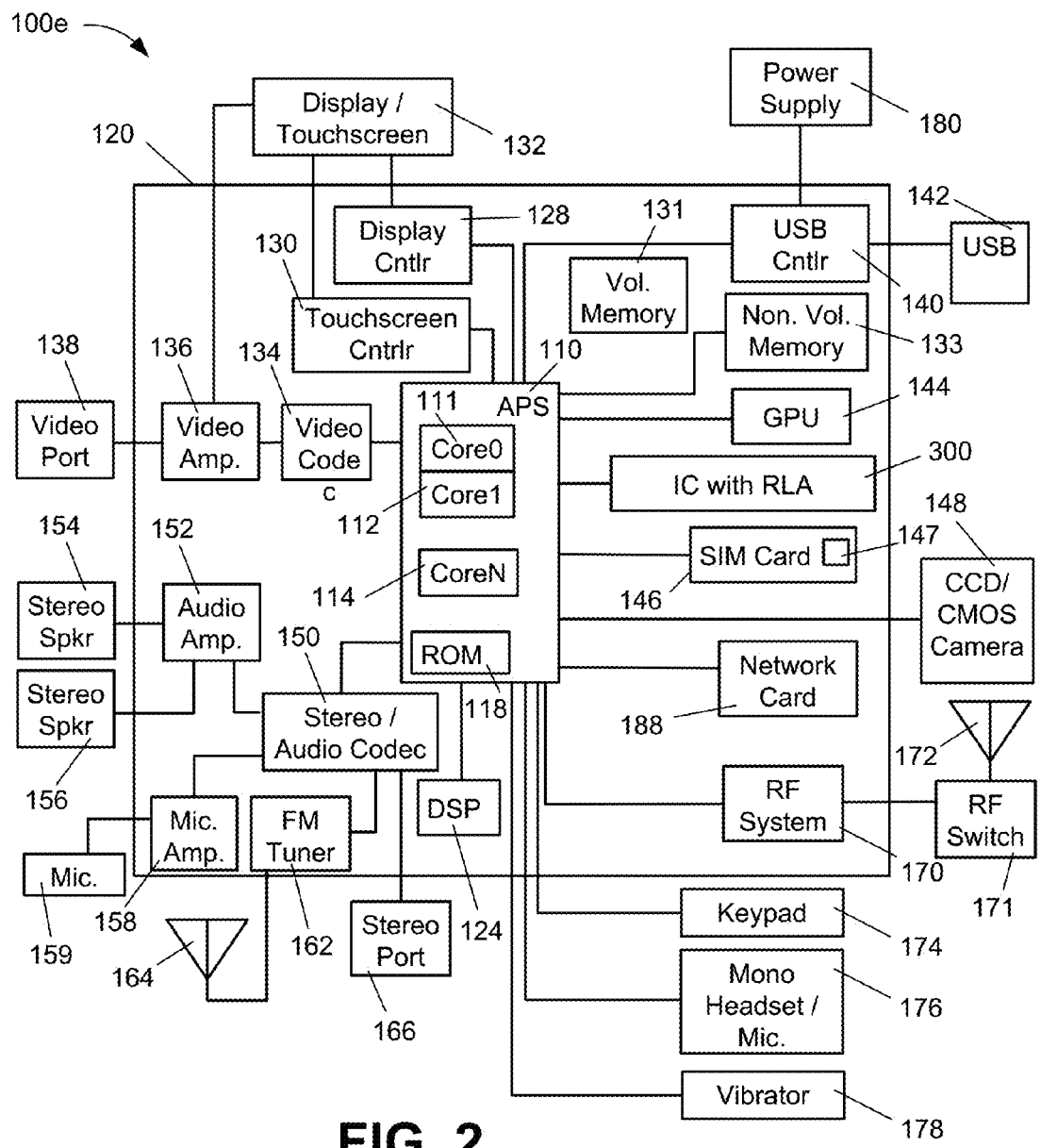
FIG. 2 is a schematic diagram illustrating an example embodiment of the portable computing device introduced in FIG. 1E.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The phrase "back-pressure condition" as used herein is intended to refer to situations where an active source cell does not have data to provide to the reconfigurable logic array or where an active sink cell cannot write to a designated external element because the designated external element is not accepting data.

The term "cell" as used herein is intended to refer to a collection of circuit connections and circuit elements that perform a desired function or functions.

The term "kernel" as used herein is intended to refer to the programmable logic implemented in a nested loop that upon completion of execution jumps or transitions to the start of the nested loop.

The term "content" may also include files having executable content, such as: object code, scripts, byte code, markup language files, and patches. In addition, "content" referred to herein, may also include files that are not executable in nature, such as documents that may need to be opened or other data files or data values that need to be accessed.

As used in this description, the terms "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer-readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

FIGS. 1A-1F each illustrate that a reconfigurable logic array (RLA) can be enabled in an integrated circuit that can be embodied in various from factors. For example, FIGS. 1A and 1B show that an RLA 330 (illustrated by way of example in FIG. 3) can be embodied in server 100a or server 100b. Although the illustrated embodiments include servers with a standalone housing, suitable servers are not so limited and may include rack mounted computers. By way of further example, FIG. 1C shows that a RLA 330 can be embodied in a desktop computing system 100c. FIGS. 1D-1F shows that a RLA 330 can be embodied in mobile computing platforms (e.g., a laptop 100d, smartphone 100e, and tablet 100f).Those skilled in the art of RLA design will understand that the disclosed systems and methods for managing pipelines in reconfigurable integrated circuits architectures are not limited to any particular style housing or form factor of a supporting computing device.

FIG. 2 is a schematic diagram illustrating an exemplary, non-limiting aspect of the portable computing device (PCD) or smartphone 100e introduced in FIG. 1E. As shown, the PCD 100e includes a system-on-chip (SoC) 120 that includes a multicore CPU or application processing system (APS) 110. The APS 110 includes a zero$^{th}$ core 111, a 1$^{st}$ or first core 112, and an N$^{th}$ core 114. The cores or processing resources 111-114 are shared processing resources that support the execution of an operating system, background functions, and one or more applications or programs on the PCD 100e. The APS 110 works in conjunction with instructions and data stored in read-only memory (ROM) 118 to initialize or configure the PCD 100e upon applying power to the various elements from power supply 180. Once initialized, the APS 110 communicates with a non-volatile memory 133 and a system or volatile memory 131, as well as the various specialized processors and controllers within the SoC 120 or coupled to the SoC 120. The non-volatile memory 133 is available for storing and retrieving system configuration information, application programs as well as storing files and any other information that can be controllably retrieved and or executed by the APS 110 or other subsystems in the PCD 100e.

The PCD 100e includes a number of other processing resources that are enabled as may be required after the APS 110 is active. In the illustrated embodiment, the other processing resources include but are not limited to a digital signal processor (DSP) 124, a graphics processing unit (GPU) 144, Stereo/Audio Codec 150, Video Codec 134, among other processors in the SoC 120.

As illustrated in FIG. 2, a display controller 128 and a touch screen controller 130 are coupled to the APS 110. In turn, display/touchscreen 132, external to the SoC 120, is coupled to the display controller 128 and the touch screen controller 130. A video CODEC 134, e.g., a phase alternating line (PAL) encoder, a sequential couleur a memoire (SECAM) encoder, or a national television system(s) committee (NTSC) encoder, is coupled to the APS 110. Further, a video amplifier 136 is coupled to the video CODEC 134 and the display/touchscreen 132. Also, a video port 138 is coupled to the video amplifier 136. As depicted in FIG. 2, a universal serial bus (USB) controller 140 is coupled to the APS 110. Also, a USB port 142 is coupled to the USB controller 140. A subscriber identity module (SIM) card 146 with a corresponding SIM store 147 may also be coupled to the APS 110. Further, as shown in FIG. 2, a digital camera 148 may be coupled to the APS 110. In an exemplary aspect, the digital camera 148 is a charge-coupled device (CCD) camera or a complementary metal-oxide semiconductor (CMOS) camera.

As further illustrated in FIG. 2, a stereo audio CODEC 150 is coupled to the APS 110. Moreover, an audio amplifier 152 is coupled to the stereo audio CODEC 150. In an exemplary aspect, a first stereo speaker 154 and a second stereo speaker 156 are coupled to the audio amplifier 152. The illustrated embodiment shows that a microphone amplifier 158 may be also coupled to the stereo audio CODEC 150. Additionally, a microphone 159 may be coupled to the microphone amplifier 158. In a particular aspect, a frequency modulation (FM) radio tuner 162 may be coupled to the stereo audio CODEC 150. Also, a FM antenna 164 is coupled to the FM radio tuner 162. Further, a stereo port 166 may be coupled to the stereo audio CODEC 150.

FIG. 2 also indicates that a radio frequency (RF) system 170 or transceiver is coupled to the APS 110. An RF switch 171 may be coupled to the RF system 170 and an RF antenna 172. As shown in FIG. 2, a keypad 174 is coupled to the APS 110. Also, a mono headset with a microphone 176 may be coupled to the APS 110. Further, a vibrator device 178 may be coupled to the APS 110. FIG. 2 further shows that a power supply 180 is coupled to the SoC 120 via the USB controller 140. In a particular aspect, the power supply 180 is a direct current (DC) power supply that provides power to the various components of the PCD 100e that require power. Further, in a particular aspect, the power supply is a rechargeable DC battery or a DC power supply that is derived from an alternating current (AC) to DC transformer that is connected to an AC power source (not shown).

FIG. 2 further indicates that the PCD 100e may also include a network card 188 that may be used to access a data network, e.g., a local area network, a personal area network, or any other network. The network card 188 may be a Bluetooth network card, a WiFi network card, a personal area network (PAN) card, or any other network card known in the art. Further, the network card 188 may be incorporated in an integrated circuit. That is, the network card 188 may be a full solution in a chip, and may not be a separate network card 188.

As depicted in FIG. 2, the display/touchscreen 132, the video port 138, the USB port 142, the camera 148, the first stereo speaker 154, the second stereo speaker 156, the microphone 159, the FM antenna 164, the stereo port 166, the RF switch 171, the RF antenna 172, the keypad 174, the mono headset 176, the vibrator 178, and the power supply 180 are external to the SoC 120.

RF system 170 or transceiver, which may include one or more modems, may support one or more of global system for mobile communications ("GSM"), code division multiple access ("CDMA"), wideband code division multiple access ("W-CDMA"), time division synchronous code division multiple access ("TDSCDMA"), long term evolution ("LTE"), and variations of LTE such as, but not limited to, FDB/LTE, PDD/LTE, and future wireless protocols.

In the illustrated embodiment, a single instance of an APS 110 is depicted. However, it should be understood that any number of similarly configured APSs can be included to support the various peripheral devices and functions associated with the PCD 100e. Alternatively, a single processor or multiple processors each having a single arithmetic logic unit or core could be deployed in a PCD 100e or other computing devices to support the various peripheral devices and functions associated with the PCD 100e as may be desired.

In a particular aspect, one or more of the method steps described herein may be enabled with the integrated circuit 300 functioning in conjunction with data and processor instructions stored in the ROM 118, the non-volatile memory 133 and/or the volatile memory 131 that are forwarded at select times via the APS 110. Although the integrated circuit 300 is illustrated as being contained within the SoC 120, the integrated circuit 300 can be a separate assembly of circuits and circuit elements in communication with the SoC 120.

Figure 3:
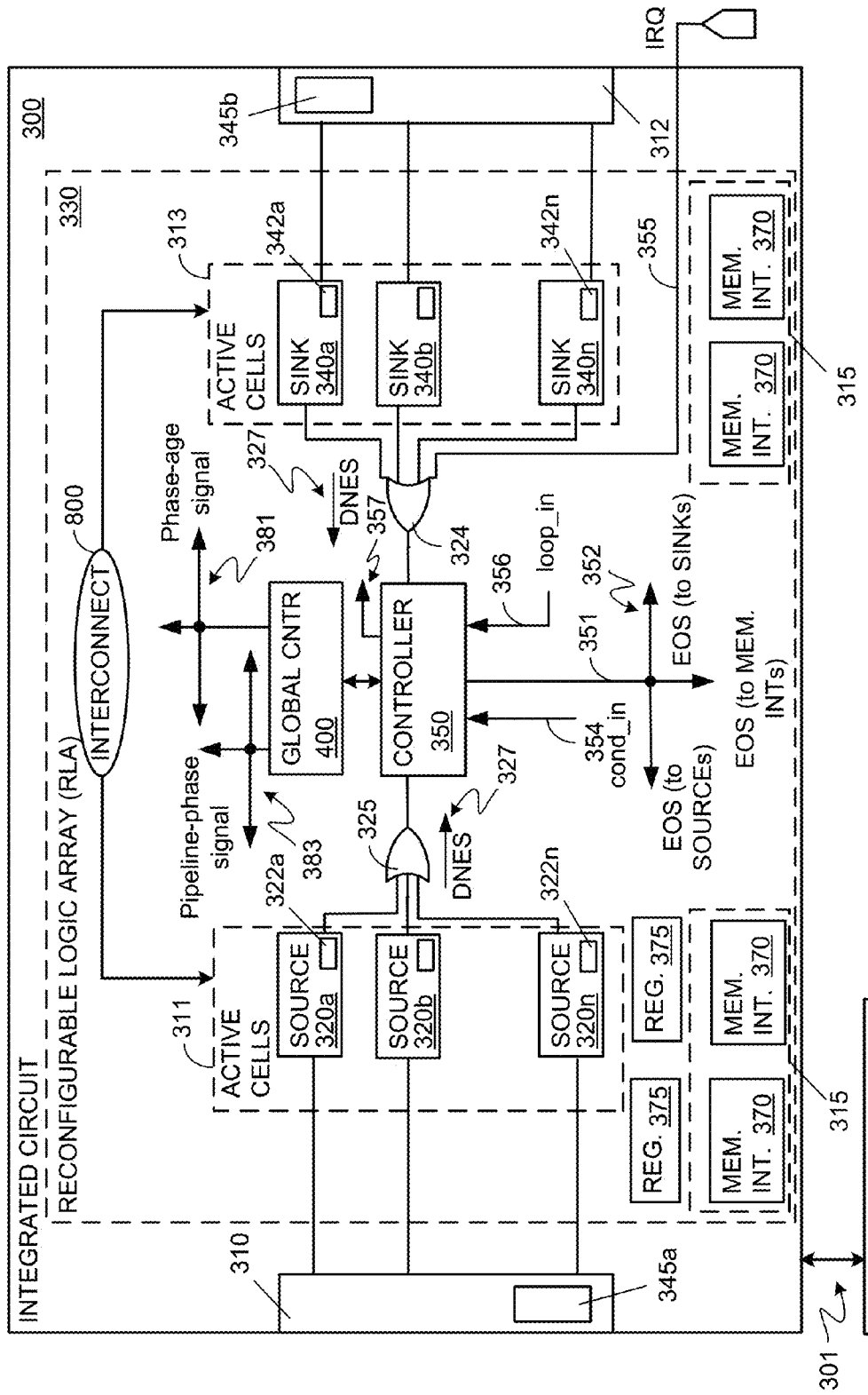
FIG. 3 is a schematic diagram illustrating an example embodiment of an integrated circuit with an improved RLA of FIG. 2.

FIG. 3 is a schematic diagram illustrating an example embodiment of an integrated circuit 300 with an improved RLA 330 as introduced in FIG. 2. For the sake of brevity, a reconfiguration/iteration controller mechanism is referred to as a 'RLA controller' or controller 350, and operations that need protection from invalid data or "garbage" during pipelining are referred to as source 320, sink 340 and local memory interface elements or memory interface elements 370. Note that the source 320, sink 340 and memory interface elements 370 in a RLA 330 are the cells or elements that have side-effects/state and thus protection valid information including state information local to each of the source 320, sink 340 and memory interface elements 370 is desired. However, it should be noted that the concepts introduced in the illustrated examples can be applied more generally, as described above. Source 320 and sink 340 cells are described in greater detail in association with FIG. 5.

Special hardware features are used wherever practical, since they avoid consuming reconfigurable resources. However, this is only practical where the number of physical resources (cells) needing protection is small. In a typical RICA design, the number of interface cells is small, making hardware protection practical for them. However, the number of registers is very large, making hardware protection broadly impractical. Reconfigurable logic is used instead to protect the state of registers. An additional technique is proposed to make hardware protection of registers practical is described in association with FIG. 8.

As illustrated in the example embodiment of FIG. 3, an integrated circuit 300 including a RLA 330 is in communication with a random access memory (RAM) 131 via a connection 301. The RLA 330 is also in communication via connection 355 with a CPU or other element external to the integrated circuit 300 that is capable of issuing or asserting an interrupt request or IRQ. As indicated in FIG. 3, the RLA 330 includes a controller 350, a global counter 400, and an interconnect 800. In addition to these elements, the RLA 330 includes a first set of active cells 311 that controllably buffer data and commands received via input buffer 310 before forwarding the data and commands to the interconnect 800. The RLA 330 also includes a second set of active elements 313 that buffer data and configuration or status information received from the interconnect 800 before forwarding the same to an output buffer 312. One or both of the input buffer 310 and the output buffer 312 may be arranged with one or more instances of first-in first-out buffers (FIFOs). FIFO 345a buffers the streaming data and commands received at the input buffer 310. FIFO 345b buffers the modified data stream and status information at the output buffer 312. A single FIFO is illustrated in each of the separate input and output buffers. Those skilled in the art will readily recognize that a desired number of FIFOs may be implemented at the interface of the integrated circuit 300 and/or in circuit elements coupled to the integrated circuit 300.

As indicated in FIG. 3, each of the source cells 320a-320n is arranged with a sensor cell 322a-322n which is arranged to assert a do-not-end step or DNES signal 327 when the corresponding sensor cell 322a-322n identifies a back pressure condition at the input buffer 310. Each of the separate instances of the sensor cells 322 forward a corresponding output to a multiple input OR gate 325, the output of which is further connected to an input of the controller 350. As illustrated in FIG. 3, the DNES signal 327 traverses from the edges of the RLA 330 form active cell 311, active cell 313, active cell 315 and the IRQ to the controller 350, which is preferably arranged at or near the middle of the RLA 330. For an example RLA 330, which may include an area of approximately 2 mm$^2$, the DNES signal paths may need to be pipelined to achieve a desired performance. This makes the logic behind the generation and interpretation of management signals more complex. The effect of this is: source cells 320 issue or assert the DNES signal before the respective source cell 320 is about to run out of data. Sink cells 340 issue or assert the DNES signal before an internal buffer is about full.

As further illustrated in FIG. 3, each of the sink cells 340a-340n is arranged with a respective sensor cell 342a-342n, which is arranged to assert a DNES signal 327 when the corresponding sensor cell 342a-342n identifies a back pressure condition at the output buffer 312. Each of the separate instances of the sensor cells 342 forward a corresponding output to a multiple input OR gate 324, the output of which is further connected to an input of the controller 350.

A third type of active cell 315 includes memory interface elements 370. This third type of active cell 315 is in communication with the RAM 131 over connection 301. The active cell 315 includes logic that identifies one or more conditions present either in the RAM 131 or the data on connection 301 when it is communicating with the active cell 315. In response to the one or more conditions, the active cell 315 asserts a cond_in signal communicated to the controller 350 on connection 354.

Back-pressure occurs in a RLA 330 when active source cells 311 do not have data (from an input buffer 310) to provide to the array of logic elements in the interconnect 800 of the RLA 330 or when active sink cells 313 cannot write to a target output element 312 (e.g., a first-in first out (FIFO) buffer 345 because the target is not accepting data.

The DNES signal travels from every SOURCE and every SINK towards the controller 350 to signal such a situation. When the DNES signal is asserted, the controller 350 can respond by suspending execution of the program executing in the interconnect 800 for a few cycles until the back-pressure is cleared. The controller 350 may respond in a similar fashion to one or more conditions associated with communication between the RAM 131 and the memory interface elements 370.

A stream data-processing kernel loop written in C for a RLA program is represented by the following:

```
int i;
for (i=0; i<1000; i++)    //
```

```
{
  unsigned in = read_source(0 /*instance*/, valid_pix /*enable*/);
  unsigned out = imaging_function(in);
  write_sink (0 /* sink instance */, result /* data */, 1 /* enable */);
}
```

The algorithm designer writes the program to loop for 1000 iterations. For example, this may include 1000 or some other number of iterations of what may be pure combinatorial (non-pipelined) input-to-output graphs or other information from a graphics processor. The number of iterations can be a variable in a program that is communicated at run time. For example, an image size stored in a configuration register in the SoC's video subsystem can be used to identify the number of iterations necessary to process the image using the RLA. Consequently, the number of iterations will vary with image size in the example. In most cases the compiler adds automatic pipelining to the graph, and to accommodate for the pipelining, the iteration count is increased. If it is assumed that the iteration count of the above loop increased to 1004 cycles (represented by iteration numbers 0-1003), as the instructions were arranged and forwarded in a pipelined fashion, the program was pipelined by 5 stages. In this case, a mechanism of making data inputs (read-side operations) from source cells 320 (or reading from memory interface elements 370) active the first 1000 iterations is desired, while data outputs (write-side operations) like the sink cells 340 (or writing to memory interface elements 370) are made active the last 1000 iterations, to avoid over-reading from a source cell 320 or memory interface element 370 and over-writing to a sink cell 340 or memory interface elements 370.

As indicated in Table I, this is achieved by annotating every iteration of the kernel with a flag or indicator that identifies whether the RLA 330 is operating in a 'Filling' (or FILL), 'Flushing' (or FLUSH) or 'Kernel' (or K) mode or cycle type:

TABLE I

| Cycle type | FILL | FILL | FILL | FILL | K | K | K | ... | K | K | K | FLUSH | FLUSH | FLUSH | FLUSH |
|---|---|---|---|---|---|---|---|---|---|---|---|---|---|---|---|
| Iteration Num | 0 | 1 | 2 | 3 | 4 | 5 | 6 | ... | 997 | 998 | 999 | 1000 | 1001 | 1002 | 1003 |
| SOURCE Active | Yes | Yes | Yes | Yes | Yes | Yes | Yes | Yes | Yes | Yes | Yes | No | No | No | No |
| SINK Active | No | No | No | No | Yes | Yes | Yes | Yes | Yes | Yes | Yes | Yes | Yes | Yes | Yes |

The read-side operations (executed by, for example, source cells 320) are active during FILL and KERNEL or K cycles, while the write-side operations (executed by, for example, sink cells 340) are active during KERNEL or K cycles and FLUSH cycles. This is achieved by placing read-side operations in the first pipeline stage and write-side operations in the last pipeline stage.

However, in real cases, the 'enable' signals coupled to source cells 320a-320n contain a long data-path that is pipelined, in which case the pipelined data-path is shifted or moved to a stage later than the first. This means that if a source cell 320a-320n were in the 2nd pipeline stage, it would deviate from the normal timing by one iteration—it should be disabled in the first iteration of filling but enabled for the first iteration of flushing. (See, e.g., Table II) Similarly, sink cells 340a-340n sometimes aren't on the critical path, in which case placing them in the last pipeline stage will use excessive reconfigurable resources (e.g. registers 375) to bring the data into the last pipeline stage. Under such circumstances, sink cells 340a-340n should be shifted to an earlier stage. Memory interface elements 370 used for read or write access should be similarly shifted or moved with read operations shifted or moved to a stage later than the first and write operations shifted or moved to an earlier stage.

To support such coordination and flexibility, each source cell 320a-320n is arranged with a configuration item, 'r_stage' (see FIG. 5) which indicates to the source cell 320a-320n when the respective source cell 320a-320n should become active for a read operation. Similarly, each sink cell 340a-340n is arranged with a configuration item, 'w_stage' (see FIG. 5), which indicates to the respective sink cell 340a-340n when the cell should become active for a write operation. While source cells 320 may be arranged with ar_stage configuration item and sink cells 340 may be arranged with a w_stage configuration item, each memory interface element 370 may be configured with both r_stage and w_stage configuration items to support configurable read and write paths.

The controller 350 keeps track of the iteration count and distributes signals to the source cells 320, sink cells 340 and memory interface elements 370 at appropriate times to indicate when the end of the loop has occurred. The controller 350 also records the number of pipeline stages the compiler created (configuration called conf_pdc_start_val). The controller 350 uses the iteration count and the number of pipeline stages created by the compiler to generate and distribute a PDC_pipeline_phase or pipeline_phase signal which identifies FLUSHING, FILLING and KERNEL modes of operation. The pipeline_phase signal is distributed via the global counter 400 to the active source cells 320, sink cells 340 and memory interface elements 370. In addition, the controller 350 generates and distributes a PDC_phase_age or phase_age signal via the global counter 400 that identifies the cycle number during the FLUSHING and FILLING modes of operation.

TABLE II

| Pipeline_phase | FILL | FILL | FILL | FILL | KERN | KERN | KERN | ... | KERN | KERN | KERN | FLUSH | FLUSH | FLUSH | FLUSH |
|---|---|---|---|---|---|---|---|---|---|---|---|---|---|---|---|
| Iteration Num | 0 | 1 | 2 | 3 | 4 | 5 | 6 | ... | 997 | 998 | 999 | 1000 | 1001 | 1002 | 1003 |
| Phase_age | 0 | 1 | 2 | 3 | -- | -- | -- | -- | -- | -- | -- | 0 | 1 | 2 | 3 |
| SOURCE R_stage = 0 | + | + | + | + | + | + | + | + | + | + | + | | | | |
| SOURCE R_stage = 1 | | + | + | + | + | + | + | + | + | + | + | + | | | |
| SOURCE R_stage = 2 | | | + | + | + | + | + | + | + | + | + | + | + | | |
| SINK W_stage = 0 | | | | | + | + | + | + | + | + | + | + | + | + | + |
| SINK W_stage = 1 | | | | + | + | + | + | + | + | + | + | + | + | + | |
| SINK W_stage = 2 | | | + | + | + | + | + | + | + | + | + | + | | | |
| | | | | | | | | | | | loop end condition (on cond input) happened | | | | |

(jump_stage = 0 in the above example).

Under certain circumstances, the logic feeding a 'cond' input 354 of the controller 350 is slow and requires pipelining. However, by pipelining the condition input 354 of the controller 350, an end condition is perceived or recognized at the controller 350 some number of iterations late. To manage such situations, the controller 350 is arranged with a loop in configuration port on connection 356, which identifies a defined number of KERNEL iterations, which should have been FLUSH iterations. Accordingly, the controller 350 generates an updated phase_age signal, which accounts for the corrected stage or jump_stage responsive to the loop_in communicated to the controller 350.

Compilers that communicate programs to RLAs must restrict the r_stage of the source cells 320 to a value greater than a jump_stage managed by the controller 350. See, e.g., Table III. Otherwise too many samples may be consumed from the input buffer. This is to avoid unnecessary delays at the end of the line in streaming mode.

TABLE III

| Pipeline_phase | FILL | FILL | FILL | FILL | KERN | KERN | KERN | ... | KERN | KERN | KERN | KERN | KERN | FLUSH | FLUSH |
|---|---|---|---|---|---|---|---|---|---|---|---|---|---|---|---|
| Iteration Num | 0 | 1 | 2 | 3 | 4 | 5 | 6 | ... | 997 | 998 | 999 | 1000 | 1001 | 1002 | 1003 |
| Phase_age | 0 | 1 | 2 | 3 | -- | -- | -- | -- | -- | -- | -- | -- | -- | 2 | 3 |
| SOURCE R_stage = 2 | | | + | + | + | + | + | + | + | + | + | + | + | | |
| SINK W_stage = 0 | | | | | + | + | + | + | + | + | + | + | + | + | + |
| SINK | | | | + | + | + | + | + | + | + | + | + | + | + | |

TABLE III-continued

| Pipeline_phase | FILL | FILL | FILL | FILL | KERN | KERN | KERN | ... | KERN | KERN | KERN | KERN | KERN | FLUSH | FLUSH |
|---|---|---|---|---|---|---|---|---|---|---|---|---|---|---|---|
| W_stage = 1 SINK | | + | + | + | + | + | + | + | + | + | + | + | | |
| W_stage = 2 | JUMP cell ignoes 'cond' | JUMP cell ignoes 'cond' | | | | | | | | | | | | loop end condition (on cond input) happened | |
| (jump_stage = 2 in this example). | | | | | | | | | | | | | | | |

At an appropriate time before the back-pressure condition has cleared, the controller 350 issues or asserts an end-of-step (EOS) signal on connection 351 that is distributed from the controller 350 (which is preferably at or near the middle of the RLA 330) to all the active elements in the RLA 330. Similarly, the phase_age signal on connection 381 and pipeline_phase signal on connection 383 are communicated to active source cells 320, sink cells 340 and memory interface elements 370 alongside the EOS signal.

The controller 350 asserts the EOS and updates global counter 400 one cycle ahead of time in anticipation of the next phase_age and phase (of course, there may be exceptions where the wrong phase is indicated (e.g., kernel instead of flushing). Each source cell 320 may be arranged with logic to deal with such conditions.

Special care has to be taken at the end of a stream of data such as an image line forwarded from the GPU 144 (FIG. 2), where the source cell 320 will run out of data (due to the blanking time) and the controller 350 needs to make sure that RLA execution continues (see limited mode description below). Some of the complexity of the present design comes from the fact that the number of iterations a kernel runs for is decided by the RLA program and the condition to keep looping is provided to the controller 350 as a 'cond_in' input. This input signal defines the end of the loop. The controller 350 responds by transitioning from kernel mode to flush or flushing mode. Both the source cells 320 and the sink cells 340 rely on the pipeline phase signal to know when the program loop executing in the RLA 330 finished. The various source cells 320 and sink cells 340 use the EOS signal as a trigger to execute logic that determines whether they are active or not. When the various cells are active and presently starved for data the logic therein issues and forwards the DNES signal to the controller 350.

This complex coordination is unavoidable when the kernel iteration number is not known when entering the program loop, i.e. when the iteration count is data-dependent (one example is a face-detection application). However, in most typical image-processing applications, the iteration count for each loop is already known and dependent on image size. Hence, a $2^{nd}$ operation mode is enabled for each of the source cells 320, sink cells 340 and the controller 350. In this second or limited mode of operation, active source cells 320, sink cells 340 and the controller 350 are provided the number of consecutive iterations of valid data that are expected before entering the loop. When this is the case, the source cells 320, sink cells 340 and the global counter 400 are aware of the start time, and are programmed to issue or assert a DNES signal on genuine back-pressure situations.

Similarly, the controller 350 operates in the limited or slow mode waiting for an indication of genuine back-pressure situations.

Because of this dependency in the execution, the controller 350 directs the RLA 330 to operate in a slow or limited mode where the controller 350 is waiting for the 3 to 4 cycles it takes to send coordinating signals back and forth between the controller 350 and each instance of active source cells 320 and sink cells 340. Such a situation arises at the end of an image line (just before blanking) where the source cell 320 looks ahead and appears if it ran out of data, but in reality the source cell 320 will be disabled soon as the end of the line has occurred (but only the controller 350 knows it).

In addition, active memory interface elements 370, source cells 320, sink cells 340, an IRQ processing cell (not shown) and status registers 375 assert commands or signals to indicate to the controller 350 when the their input data coming from the interconnect 800 has to be updated and when their output data has to be changed.

Figure 4:
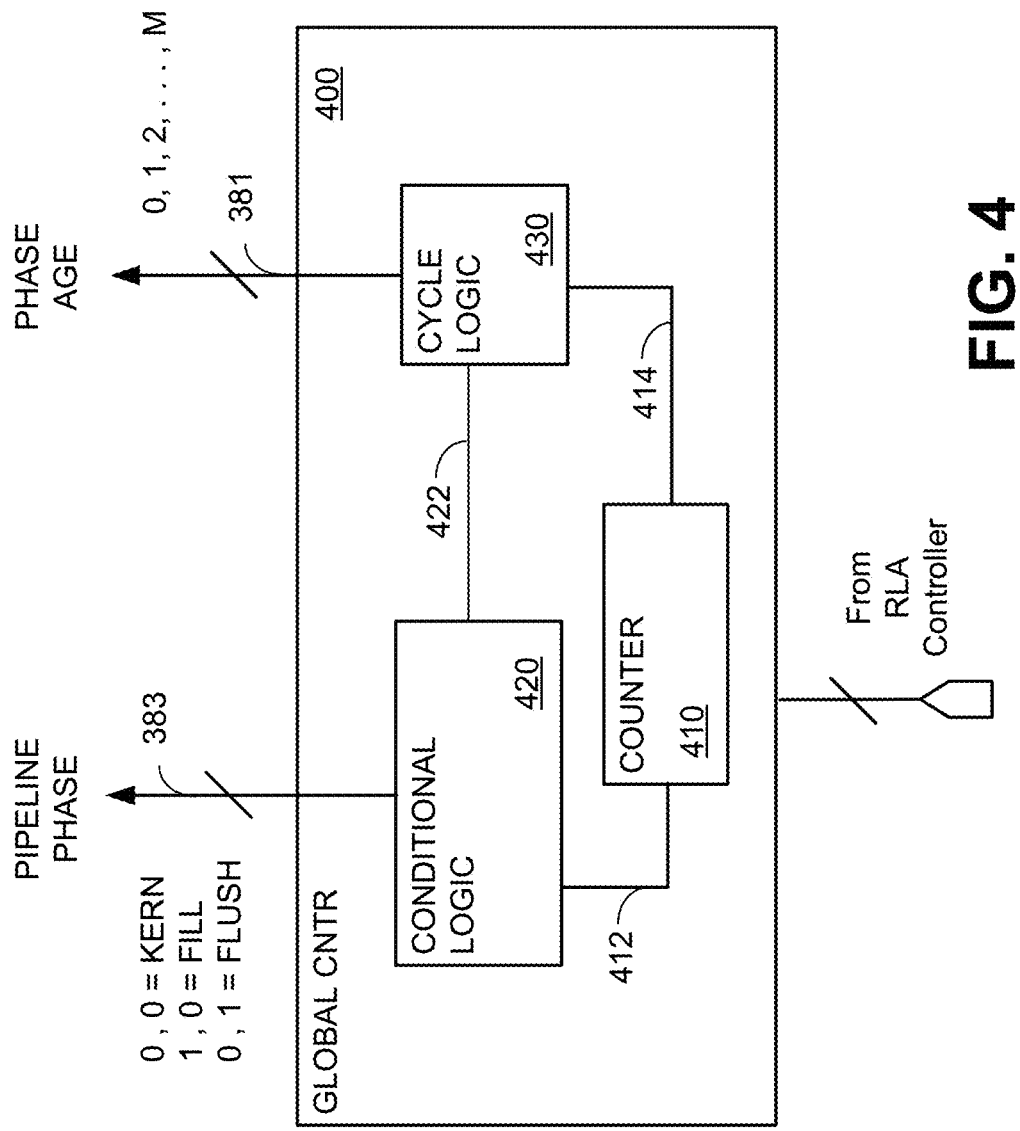
FIG. 4 is a schematic diagram illustrating an example embodiment of a global counter responsive to the RLA controller of FIG. 3.

FIG. 4 is a schematic diagram illustrating an example embodiment of the global counter 400 introduced in FIG. 3. As indicated, the global counter 400 receives clock and data signals from the controller 350. An internal counter 410 distributes an indication of the present cycle and or other signals to the conditional logic 420 on connection 412 and one or more similar signals to the cycle logic 430 on connection 414. The conditional logic 420 forwards the pipeline phase signal on connection 383, the pipeline phase signal indicates whether the RLA is operating in a fill, kernel, or flush mode. In addition to the pipeline phase signal on connection 383, the conditional logic 420 asserts a signal on connection 422 that enables the cycle logic 430. The enable signal on connection 422 is asserted when the RLA is functioning in one of the fill or flush modes of operation. The cycle logic 430, when enabled, forwards a phase age signal that identifies a cycle or stage in the in the present fill or flush operation.

Figure 5:
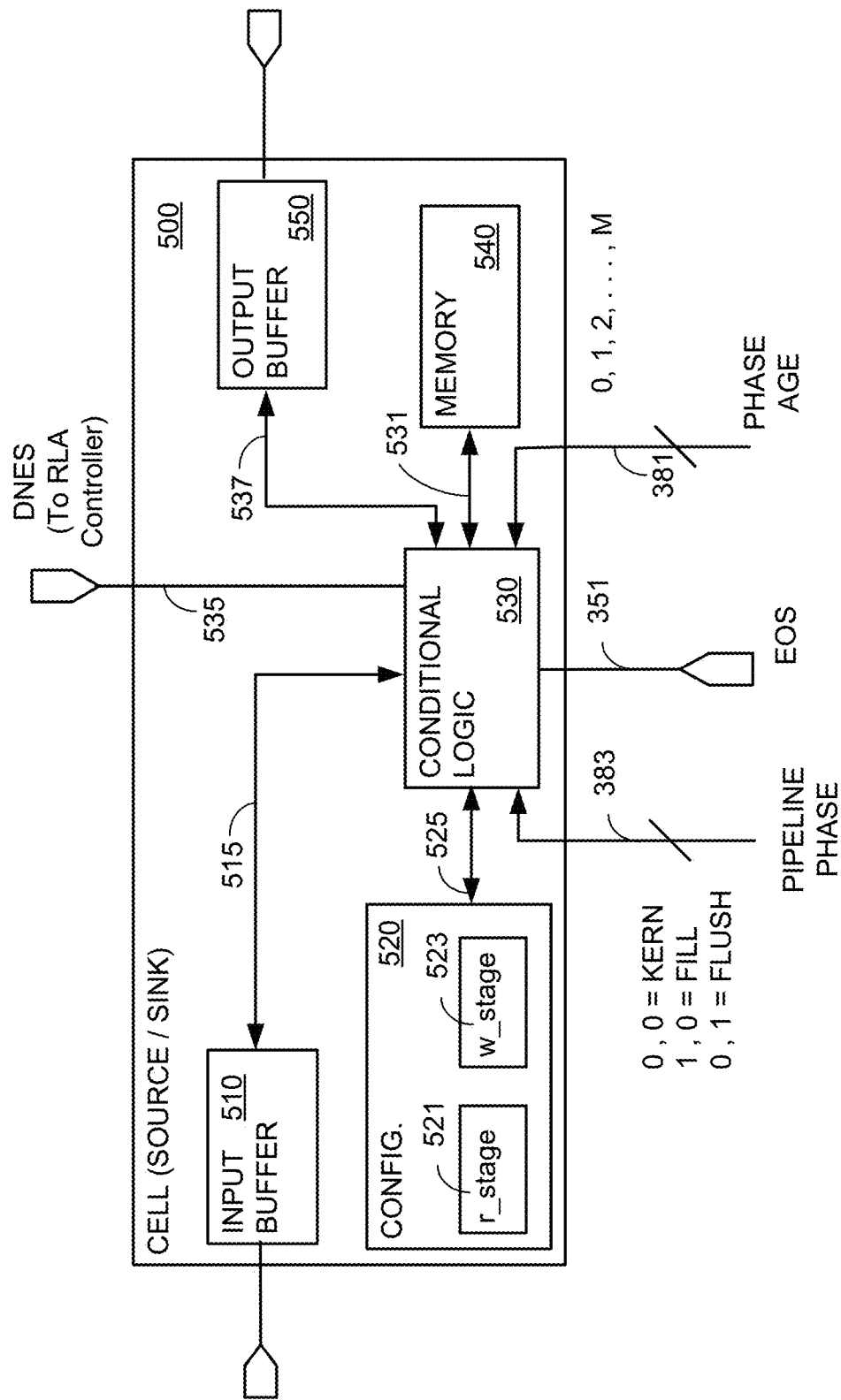
FIG. 5 is a schematic diagram illustrating an example embodiment of a cell in the RLA of FIG. 2.

FIG. 5 is a schematic diagram illustrating an example embodiment of a cell in the RLA 330 of FIG. 2. In the illustrated embodiment the cell 500 includes an input buffer 510, output buffer 550, configuration element 520, conditional logic 530 and a local memory 540. The input buffer 510 is arranged to receive a data stream or configuration information at an input and forwards the information on connection 515 to the conditional logic 530. The output buffer 550 receives the data stream on connection 537 from the conditional logic 530 and forwards the same at an output connection to a designated target or targets in the RLA 330. The conditional logic 530 operates in accordance with the EOS signal received on connection 351, the pipeline phase signal received on connection 383 and the phase age signal on connection 381. The conditional logic 530 further operates in accordance with ar_stage parameter 521 when acting as a source cell and a w_stage parameter 523 when acting as a sink cell. The local memory element 540 receives state information on connection 531 from the conditional controller 530. When the conditional logic or a sensor 322a, 342a coupled to the conditional logic 530 identifies a back pressure condition in the input buffer 510 the output buffer 550 or in devices connected to these elements, the cell 500 asserts a DNES signal on connection 535 which is communicated to the controller 350. As further indicated in FIG. 5, the cell 500 and more specifically the conditional logic 530 is arranged to receive an EOS signal issued or asserted by the controller 350 on connection 351.

Figures 6, 7:
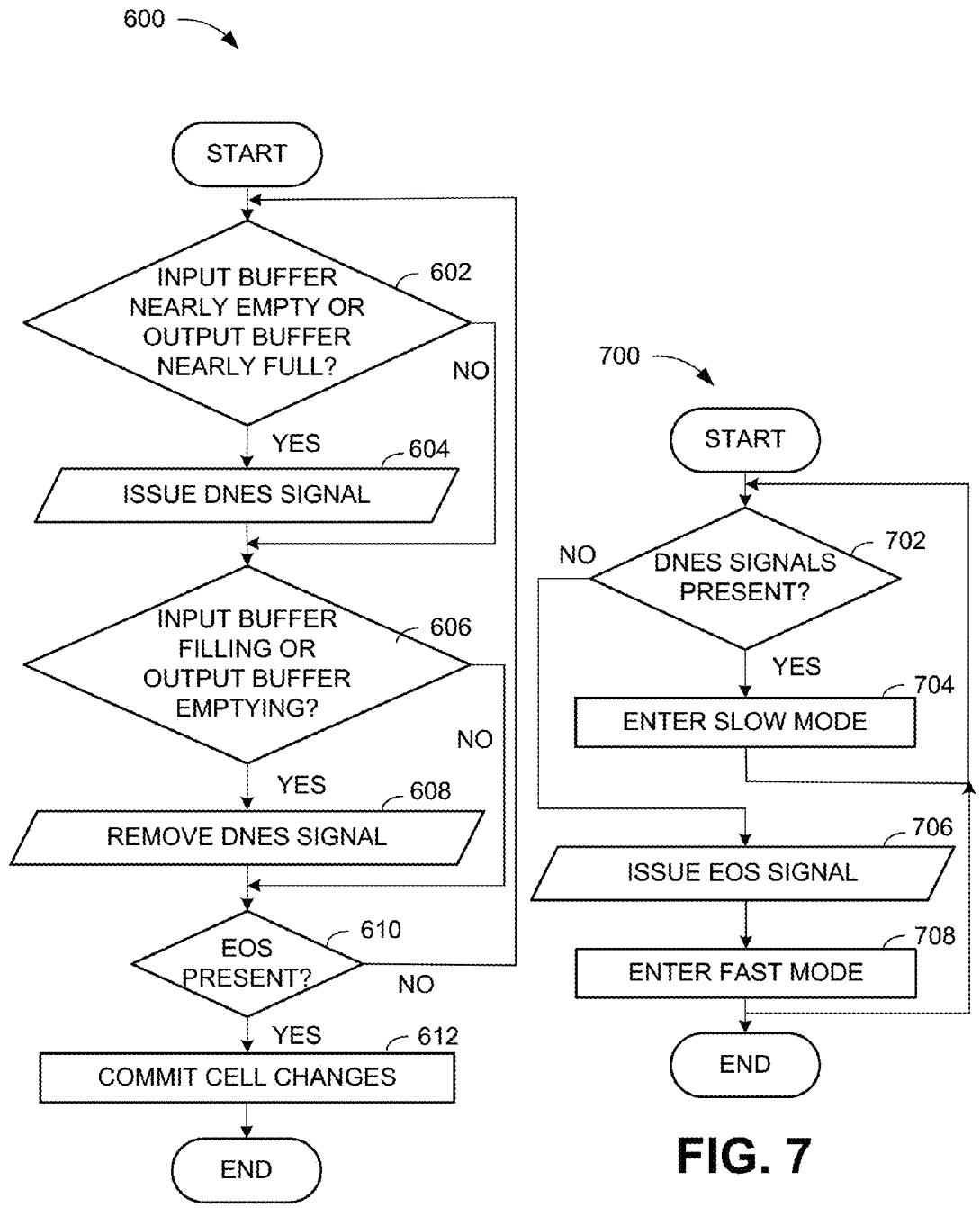
FIG. 6 is a flow diagram illustrating an example embodiment of a method for generating and communicating control signals from the cell of FIG. 5.
FIG. 7 is a flow diagram illustrating an example embodiment of a method for managing RLA modes of operation and communicating with active cells from the RLA controller of FIG. 3.

FIG. 6 is a flow diagram illustrating an example embodiment of a method 600 for generating and communicating control signals from the cell 500 of FIG. 5. The method 600 begins with decision block 602 where it is determined if an input buffer is nearly empty or an output buffer is nearly full. When a source cell determines that an input buffer is nearly empty or a sink cell determines that an output buffer, such as a first-in first out (FIFO) buffer, is nearly full, as indicated by the flow control arrow labeled, "yes," exiting decision block 602, the respective cell issues a do-not-end step or DNES signal as indicated in input/output block 604, which as described above is forwarded to an input of the controller 350.

Otherwise, if either of the two conditions in decision block 602 are not found, processing continues, as indicated by the flow control arrow labeled "no," exiting decision block 602, with the query illustrated in decision block 606. More specifically, the cell 500 determines if the input buffer is filling or the output buffer is emptying. When either condition is present, as indicated by the flow control arrow labeled, "yes," exiting decision block 606, the respective cell removes (or no longer asserts) the DNES signal, as indicated in input/output block 608. The DNES signal is forwarded to an input of the controller 350.

Otherwise, if either of the two conditions in decision block 606 are not found, processing continues, as indicated by the flow control arrow labeled "no," exiting decision block 606 with the query illustrated in decision block 610. More specifically, cell 500 determines if an end-of-step or EOS signal has been asserted and distributed by the controller 350. When the EOS signal is present, as indicated by the flow control arrow labeled, "yes," exiting decision block 610, the respective cell commits the cell changes, as shown in block 612. Otherwise, when the EOS signal is not present at the cell 500, as indicated by the flow control arrow labeled "no," exiting decision block 610, processing continues by repeating the functions in blocks 602 through 610 for as long as the cell 500 remains active.

FIG. 7 is a flow diagram illustrating an example embodiment of a method 700 for managing RLA modes of operation and communicating with active cells 500 from the RLA controller 350 of FIG. 3. The method 700 begins with decision block 702 where the controller 350 determines if an active cell 500 has issued a DNES signal. When an active cell 500 has issued a DNES signal, the controller responds as indicated in block 704 and by the flow control arrow exiting block 704 by entering a slow mode of operation. When a DNES signal is not present, as indicated by the flow control arrow labeled, "no," exiting decision block 702, the controller 350 responds by issuing an EOS signal at an appropriate time, as shown in input/output block 706 and by returning to a fast mode of operation as indicated in block 708. As further indicated in the flow diagram the method 700 repeats the functionality indicated in association with blocks 702 through 708 for as long as the controller 350 remains active.

Figure 8:
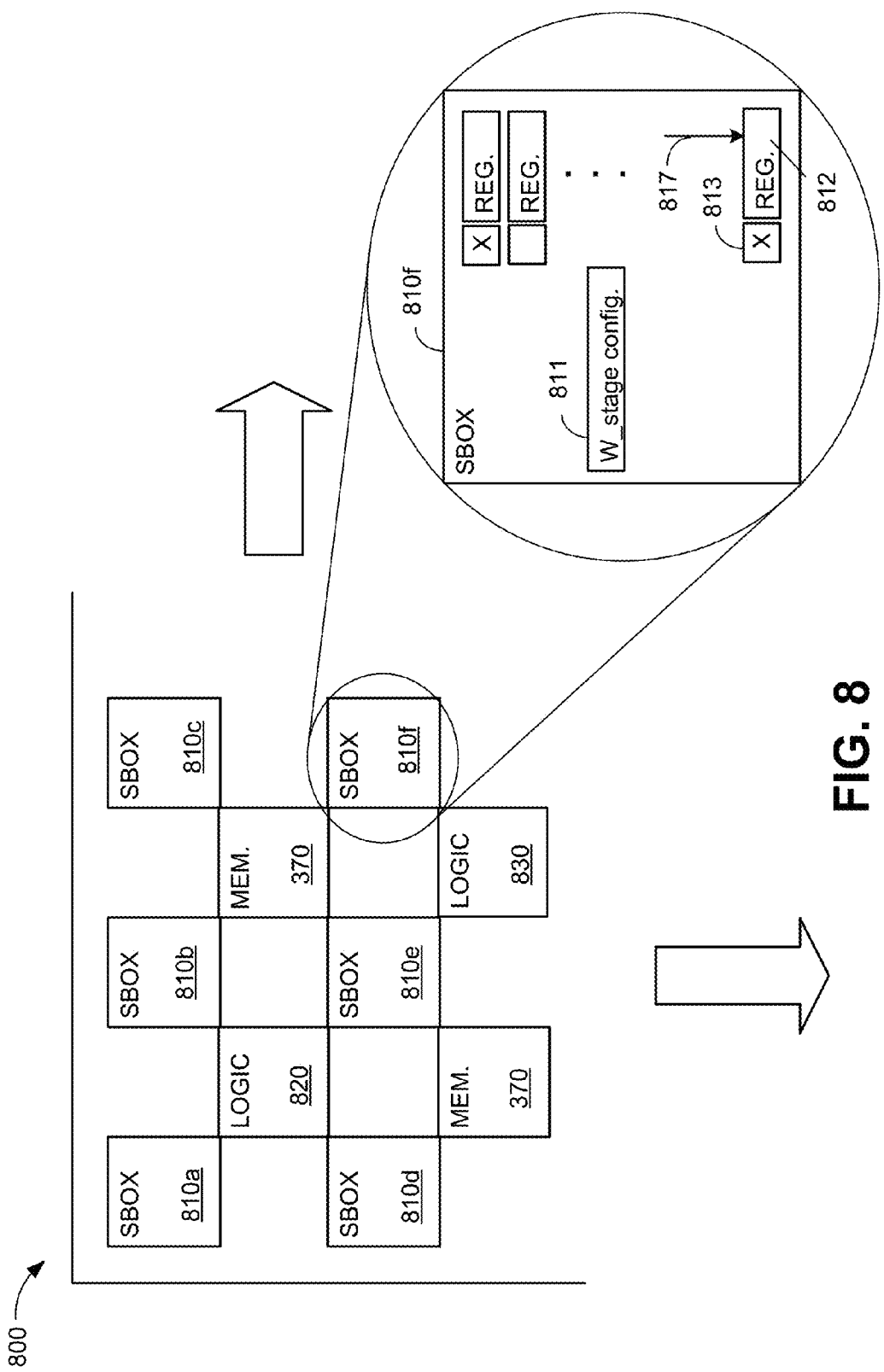
FIG. 8 is a schematic diagram illustrating an example embodiment of the interconnect of FIG. 3.

FIG. 8 is a schematic diagram illustrating an example embodiment of the interconnect 800 of FIG. 3. The interconnect 800 includes a fabric or network of interconnected switching elements or SBOXs 810a-810n distributed about the RLA 330. Interposed between the individual SBOX members in the network are various LOGIC cells such as logic cell 820 and logic cell 830 and local memory elements 370. The logic cells 820, 830 include circuits and circuit elements that enable a corresponding desired function or functions (e.g., adders, accumulators, dividers, multipliers, etc.). The local memory elements 370 provide storage for status, temporary results or other information designated for use in a subsequent logic cell 820, 830. Certain registers in the local memory elements 370 or logic cells 820, 830 will be both read from and written to in the kernel (e.g. registers supporting counters, accumulators). Which registers—and the number of such registers—depends on the algorithm being implemented. Furthermore, only a subset of these will contain useful information on initial entry into the kernel, and carry useful information on final exit from the kernel. If left unprotected, the former will be corrupted during filling (unless in the first pipeline stage), and the latter will be corrupted during flushing (unless in the last pipeline stage).

The area overhead of having each hardware register in a RLA 330 uniquely protected by special hardware (e.g., the 'w_stage' mechanism presented earlier) is too high. However, the registers that need protection are typically a small fraction of the registers in a kernel, and a tiny fraction of the total registers available in the RLA 330. As indicated, conventional designs rely on utilizing reconfigurable resources to protect information in some registers.

However, some algorithms have a very large number of registers that are "live" or in use on initial entry or that remain "live" on final exit. Typically these algorithms have a large variable window (i.e., a conceptual window of input data represented by a 2D array variable in the C source code, where each element of the array is stored in a unique register of the RLA 330) that is "live" on entry and exit. In these cases, the overhead of using software protection is too high. The novel hardware-based solution that follows can be used to cover these cases, with a significant reduction in area overhead than possible with the solutions of conventional RLA designs.

The proposed solution makes use of the fact that the large register windows can be placed in a single pipeline stage, and the elements are usually spatially close. Therefore, with suitable constraints placed during the allocation process of mapping an algorithm onto the array, it is acceptable for many registers to share the same 'w_stage' information. This significantly reduces the number of extra configuration values needed in the hardware, which in turn reduces the area overhead, making the solution practical.

As illustrated in FIG. 8, register cells or local memory elements 370 are part of the interconnect 800—and thus are contained or proximal to an adjacent SBOX 810a-810n. Each SBOX has a number of registers, available on a subset of the output channels. The proposed solution consists of adding a single 'w_stage' configuration 811 to each SBOX 810. A subset of the registers 812 of that SBOX 810 will have a 1-bit configuration 813 specifying whether they are influenced by the 'w_stage' value in the 'w_stage' configuration 811. The mechanism (hardware) is similar to the 'w_stage' logic presented earlier. The SBOX 810 needs access to the PDC signals (i.e., the pipeline_phase and phase_age signals). When a register is influenced by the SBOX's 'w_stage' value, the hardware controls the register's write-enable 817, preventing it from being overwritten by "garbage" or invalid information during filling and flushing operations. That is, when the write-stage indicator 813 associated with a particular register 812 is set, a write enable control 817 for the register 812 is disabled. Each instance of an SBOX 810 controls when a data register 812 gets written and when the current configuration information gets updated.

Due to the necessary grouping, this solution won't support all cases. Where the described solution cannot be used, the software-based solution described in the prior art can be used as a fallback. Furthermore, the two solutions can be mixed in the same kernel. This new hardware solution should be used wherever possible, to minimize the consumption of reconfigurable resources for pipelining logic.

Figure 9:
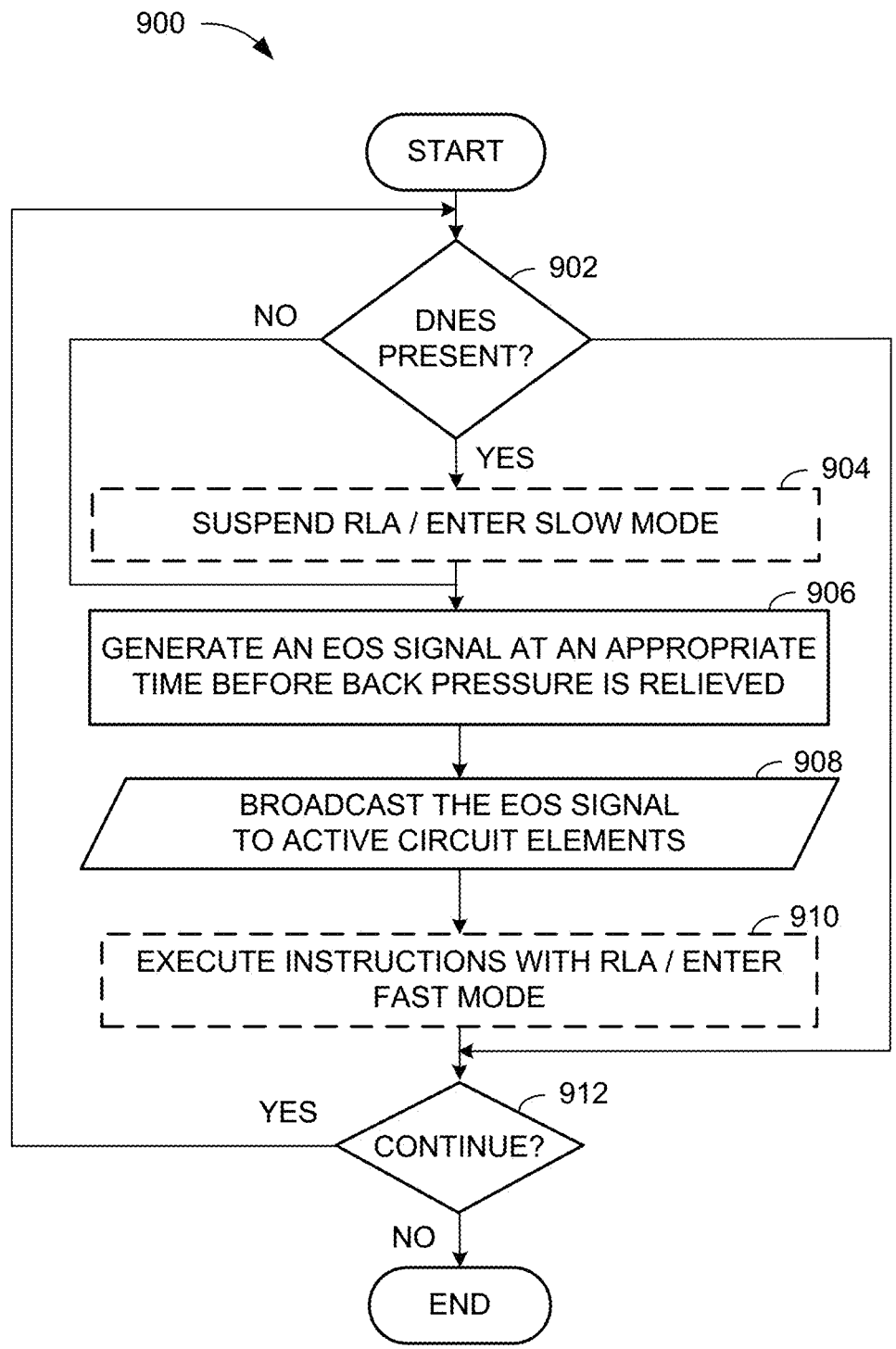
FIG. 9 is a flow diagram illustrating an alternative embodiment of a method for managing pipelines with the improved RLA of FIG. 3.

FIG. 9 is a flow diagram illustrating an alternative embodiment of a method 900 for managing pipelined logic with the improved RLA controller 350 of FIG. 3. The method 900 begins with decision block 902 where the controller 350 determines if an active cell 500 has issued a DNES signal. When an active cell 500 has issued a DNES signal, the controller 350 optionally responds, as indicated in block 904 by way of broken line and by the flow control arrow exiting block 902, labeled "yes," by suspending execution of the program executing in the RLA and entering a slow mode of operation. When a DNES signal is not present, as indicated by the flow control arrow labeled, "no," exiting decision block 902, the controller 350 responds by bypassing the functions illustrated in association with block 904 and generates an EOS signal at an appropriate time before back pressure is relieved, as shown in block 906. Thereafter, as indicated in input/output block 908, the controller 350 directs the broadcast of the EOS signal to active cells in the RLA. Next, the controller 350 optionally directs the RLA to execute instructions and returns to a fast mode of operation as indicated in block 910. As further indicated in the flow diagram, and more specifically decision block 912, the method 900 repeats the functionality indicated in association with blocks 902 through 912 for as long as may be desired.

Figure 10:
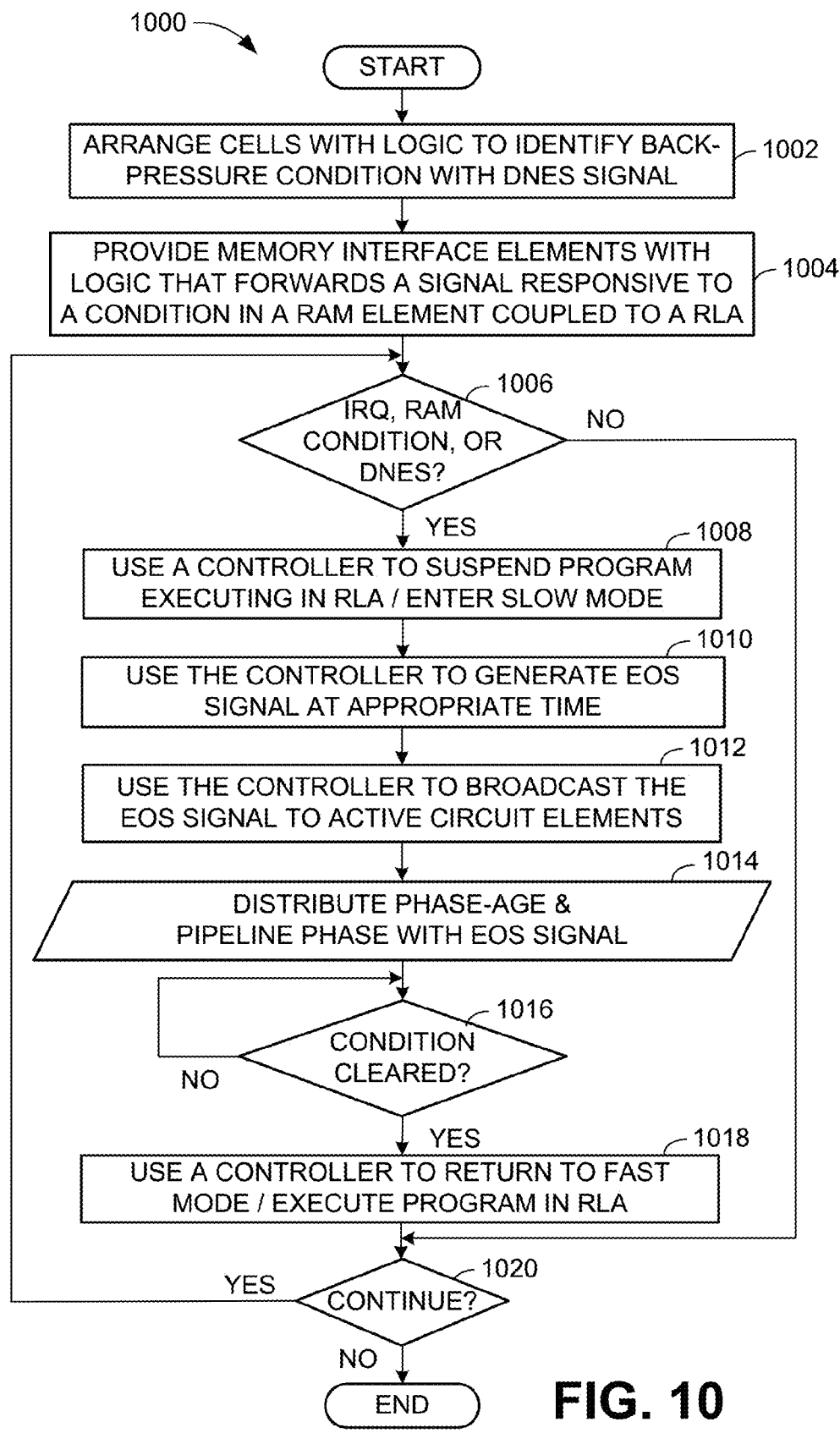
FIG. 10 is a flow diagram illustrating another alternative embodiment of a method for compensating for latency in a RLA of FIG. 3.

FIG. 10 is a flow diagram illustrating another alternative embodiment of a method 1000 for compensating for latency in a RLA 330 of FIG. 3. The method 1000 begins with block 1002 where cells (i.e., source and sink cells) are arranged with respective logic and sensors to identify a back-pressure condition and issue or assert a DNES signal. In block 1004, memory interface elements are arranged with respective logic and sensors that identify a condition or conditions in a RAM coupled to the RLA 300 and issue or assert a signal indicative of the condition. As described above, the DNES signal and the signal or signals from the memory interface elements are communicated to the controller 350. As indicated in decision block 1006, the controller 350 determines if it has received an IRQ, a signal indicative of a RAM condition, or a DNES signal. When one or more of the signals are not present, the method 1000 bypasses the functions associated with blocks 1008 through 1018 and makes a determination in decision block 1020 whether to continue to process a program with the RLA 300. When the response to the query in decision block 1020 is affirmative, the method 1000 returns and repeats the functions in blocks 1006 through 1018.

Otherwise, when one of the signals is present, the method 1000 continues with block 1008, where the controller 350 suspends execution of the program in the RLA 300 and enters a slow mode of operation. In block 1010, the controller 350 generates an EOS signal at an appropriate time prior to when the back pressure condition is expected to clear. In block 1012, the controller 350 uses a global counter 400 to broadcast the EOS signal to active circuit elements such as the source and sink cells 500 in the RLA 300. In block 1014, the controller 350 uses the global counter 400 to generate and distribute phase age and pipeline phase signals with the EOS signal. As described above the pipeline phase signals identifies when the RLA is operating in a FILL, FLUSH or KERNEL mode and the phase age identifies a particular cycle in one of the FILL and FLUSH modes. In decision block 1016, the controller 350 determines when the condition identified in block 1006 has cleared. Once this is the case, the controller 350 returns to a fast mode of operation and directs the RLA to resume execution of a program, as indicated in block 1018.

Certain steps in the processes or process flows described in this specification naturally precede others for the computing device to function as described. However, the computing device and described methods are not limited to the order of the steps described if such order or sequence does not alter the described functionality. That is, it is recognized that some steps may performed before, after, or in parallel (substantially simultaneously) with other steps without departing from the scope of the claimed computing device and methods. In some instances, certain steps may be omitted or not performed. Further, words such as "thereafter", "then", "next", "subsequently", etc. are not intended to limit the order of the steps. These words are simply used to guide the reader through the description of the exemplary method.

Additionally, one of ordinary skill in power management within a portable, desktop, or server computing device is able to identify appropriate hardware and/or circuits and/or identify appropriate logic and determinations to implement the disclosed embodiments without difficulty based on this specification. Therefore, disclosure of a particular set of program code instructions, decision thresholds or detailed hardware devices is not considered necessary for an adequate understanding of how to make and use the disclosed computing devices and operating methods. The inventive functionality and aspects of the claimed processor-enabled processes and circuit architectures are explained in more detail in the above description and in conjunction with the drawings, which may illustrate various process flows.

In one or more exemplary aspects as indicated above, the functions described may be implemented in hardware, software, firmware, or any combination thereof. If implemented in software, the functions may be stored as one or more instructions or code on a computer-readable medium, such as a non-transitory processor-readable medium. Computer-readable media include data storage media.

A storage media may be any available media that may be accessed by a computer or a processor. By way of example, and not limitation, such computer-readable media may comprise RAM, magneto-resistive RAM (MRAM), ROM, EEPROM, NAND Flash, NOR Flash, spin-torque MRAM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of non-transitory computer-readable media.

Although selected aspects have been illustrated and described in detail, it will be understood that various substitutions and alterations may be made herein without departing from the present systems and methods, as defined by the following claims.

What is claimed is:

1. An integrated circuit, comprising:
   a reconfigurable logic array comprising a plurality of cells electrically coupled via an interconnect and configured to perform an identified task;
   one or more of the plurality of cells designated as an active cell configured with a sensor that identifies a back pressure condition at an interface coupled to the active cell, wherein the active cell communicates a do-not-end-step signal in response to the back pressure condition;
   a controller electrically coupled to the interconnect and arranged to receive the do-not-end step signal and suspend execution of the identified task in the reconfigurable logic array_in response to a global counter of a number of iterations to perform the identified task.

2. The integrated circuit of claim 1, wherein the controller is further arranged to suspend execution in the reconfigurable logic array upon receipt of an interrupt request.

3. The integrated circuit of claim 1, further comprising:
   a set of local memory interface cells distributed throughout the reconfigurable logic array, the local memory interface cells arranged to forward a signal responsive to a condition of a volatile memory element coupled to the reconfigurable logic array.

4. The integrated circuit of claim 3, wherein the controller upon receipt of the signal responsive to the condition of the volatile memory element suspends execution of the reconfigurable logic array.

5. The integrated circuit of claim 4, wherein the condition of the volatile memory element indicates that data needs to be written to the volatile memory element and a write request is indicated.

6. The integrated circuit of claim 1, wherein the controller generates and distributes
   a phase-age signal and a pipeline-phase signal to the active cell in response to the global counter.

7. The integrated circuit of claim 6, wherein the controller updates the global counter and communicates an end-of-step signal at an appropriate time to elements in the reconfigurable logic array to control when data gets written to internal registers.

8. The integrated circuit of claim 1, wherein the active cell is a source configured to transmit the do-not-end-step signal at an appropriate time before source buffered data is exhausted.

9. The integrated circuit of claim 1, wherein the active cell is a sink configured to transmit the do-not-end-step signal at an appropriate time before a first-in first-out buffer reaches capacity.

10. The integrated circuit of claim 1, wherein the controller receives an input responsive to the number of iterations to complete the identified task.

11. The integrated circuit of claim 10, wherein the controller communicates the number of iterations to at least one of a source and a sink prior to entering a loop of instructions.

12. The integrated circuit of claim 1, wherein the interconnect includes a switch box arranged to receive a write-stage configuration.

13. The integrated circuit of claim 12, wherein the switch box includes at least one register responsive to a write-stage influence indicator, wherein when the write-stage indicator is set, a write enable control for the register is disabled.

14. The integrated circuit of claim 13, wherein a subset of registers is associated with the write-stage influence indicator.

15. A method for managing a reconfigurable logic array in a computing device, the method comprising:
   identifying at least one task to be performed by a reconfigurable logic array comprising a plurality of cells electrically coupled via an interconnect, wherein a number of loop iterations to complete the at least one task is known;
   receiving, with a controller, a do-not-end-step signal responsive to a back pressure condition identified by an active cell of the reconfigurable logic array;
   using the controller to generate an end-of-step signal before a change in the back pressure condition based on a global counter associated with the number of loop iterations; and
   broadcasting the end-of-step signal.

16. The method of claim 15, wherein the active cell includes at least one selected from the group consisting of a source, a sink, and a local memory interface.

17. The method of claim 16, wherein the local memory interface cells are arranged to forward a signal responsive to a condition of a volatile memory element coupled to the reconfigurable logic array.

18. The method of claim 17, wherein the signal responsive to the condition of the volatile memory element indicates that data needs to be written to the volatile memory element and a write request is indicated.

19. The method of claim 17, wherein the signal responsive to the condition of the volatile memory element directs the controller to suspend execution with the reconfigurable logic array.

20. The method of claim 15, further comprising:
   receiving an interrupt request at the controller; and
   responding to the interrupt request by using the controller to suspend execution with the reconfigurable logic array.

21. The method of claim 20, wherein the interrupt request directs the reconfigurable logic array to wait for an external event.

22. The method of claim 15, further comprising:
   suspending execution with the reconfigurable logic array until the back pressure condition is cleared.

23. The method of claim 15, further comprising:
   updating the global counter in anticipation of a subsequent pipeline phase transition; and
   distributing a phase-age signal and a pipeline-phase signal together with the end-of-step signal.

24. The method of claim 15, wherein the active cell is a source configured to transmit the do-not-end-step signal at an appropriate time before source buffered data is exhausted.

25. The method of claim 15, wherein the active cell is a sink configured to transmit the do-not-end-step signal at an appropriate time before a first-in first-out buffer reaches capacity.

26. The method of claim 15, wherein broadcasting the end-of-step signal comprises communicating the end-of-step signal to elements in the reconfigurable logic array to control when data gets written to a cell memory.

27. The method of claim 26, further comprising:
waiting for elements in the reconfigurable logic array to identify when data coming from the reconfigurable logic array has to be updated and when output data has to be modified.

28. The method of claim 15, further comprising:
prior to entering a loop responsive to the at least one task, communicating the number of loop iterations of valid data to a source, a sink and the controller.

29. The method of claim 15, further comprising:
providing a write-stage configuration to a switch box;
associating a write-stage influence indicator with a register in the switch box;
when the write-stage influence indicator is set, disabling a write-enable control input for the register.

30. The method of claim 29, wherein disabling the write enable control input is performed in conjunction with filling or flushing the reconfigurable logic array.

* * * * *